(12) United States Patent
Pellerite et al.

(10) Patent No.: US 9,711,263 B2
(45) Date of Patent: Jul. 18, 2017

(54) CORONA PATTERNING OF OVERCOATED NANOWIRE TRANSPARENT CONDUCTING COATINGS

(71) Applicant: 3M INNOVATIVE PROPERTIES COMPANY, St. Paul, MN (US)

(72) Inventors: Mark J. Pellerite, Woodbury, MN (US); Seth M. Kirk, Minneapolis, MN (US); Hyacinth L. Lechuga, St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 14/384,100

(22) PCT Filed: May 2, 2013

(86) PCT No.: PCT/US2013/039174
§ 371 (c)(1),
(2) Date: Sep. 9, 2014

(87) PCT Pub. No.: WO2013/173070
PCT Pub. Date: Nov. 21, 2013

(65) Prior Publication Data
US 2015/0076106 A1    Mar. 19, 2015

Related U.S. Application Data
(60) Provisional application No. 61/648,926, filed on May 18, 2012.

(51) Int. Cl.
B05D 3/06     (2006.01)
H01B 13/00   (2006.01)
(Continued)

(52) U.S. Cl.
CPC ............ H01B 13/003 (2013.01); H01B 1/22 (2013.01); H01L 51/0021 (2013.01);
(Continued)

(58) Field of Classification Search
CPC ....... H01B 1/22; H01B 13/003; H01L 51/102; H01L 51/442; H01L 51/5206;
(Continued)

(56) References Cited

U.S. PATENT DOCUMENTS 4,879,430 A    11/1989  Hoffman
5,139,804 A    8/1992   Hoffman
(Continued)

FOREIGN PATENT DOCUMENTS

JP    2009-252437    10/2009
JP    2010-287540    12/2010
(Continued)

OTHER PUBLICATIONS

Machine translation of JP 2010-287540 A by Yokogawa, published Dec. 24, 2010.*
(Continued)

*Primary Examiner* — Marianne L Padgett
(74) *Attorney, Agent, or Firm* — Clifton F. Richardson; Stephen L. Crooks

(57) ABSTRACT

A method comprising: providing a transparent electrically conductive film comprising: a transparent substrate (14); a composite layer (18) comprising: an electrically conductive layer disposed on at least a portion of a major surface of the transparent substrate (14) and comprising a plurality of interconnecting metallic nanowires (12); and a polymeric overcoat layer disposed on a portion of the electrically conductive layer, to provide a coated area of the electrically conductive layer; and patternwise exposing the coated area of the electrically conductive layer to a corona discharge to
(Continued)

provide a patternwise exposed electrically conductive film comprising (1) an un exposed region (122) of the coated region having a first electrical resistivity, and (2) an exposed region (121) having a second electrical resistivity; wherein the exposed region is less electrically conductive than the unexposed region, and wherein there is a ratio of the second electrical resistivity over the first electrical resistivity of at least 1000:1.

13 Claims, 11 Drawing Sheets

(51) Int. Cl.
    H01L 51/52      (2006.01)
    H01B 1/22       (2006.01)
    H01L 51/00      (2006.01)
    H01L 51/10      (2006.01)
    H01L 51/44      (2006.01)
    H05K 9/00       (2006.01)
    H01L 27/32      (2006.01)

(52) U.S. Cl.
    CPC .......... *H01L 51/102* (2013.01); *H01L 51/442* (2013.01); *H01L 51/5206* (2013.01); *H01L 51/5215* (2013.01); *H05K 9/009* (2013.01); *H05K 9/0094* (2013.01); *H01L 27/3239* (2013.01); *Y02E 10/549* (2013.01)

(58) Field of Classification Search
    CPC .. H01L 27/3239; H01K 9/0094; H01K 9/009; Y02E 10/549
    USPC ....... 427/534, 535, 536, 537, 538, 539, 540, 427/162–165
    See application file for complete search history.

(56) References Cited

U.S. PATENT DOCUMENTS

| | | | |
|---|---|---|---|
| 7,442,442 B2 | 10/2008 | Strobel | |
| 7,858,499 B2 | 12/2010 | Plaut | |
| 8,008,783 B2 | 8/2011 | Plaut | |
| 8,018,568 B2 | 9/2011 | Allemand | |
| 8,076,583 B2 | 12/2011 | Shimizu | |
| 9,199,438 B2 * | 12/2015 | Bories-Azeau | B32B 33/00 |
| 9,520,211 B2 * | 12/2016 | Lee | H01B 1/02 |
| 9,541,578 B2 * | 1/2017 | Shimada | G06F 3/044 |
| 2004/0048048 A1 | 3/2004 | Lamotte | |
| 2004/0175844 A1 | 9/2004 | Yang | |
| 2007/0074316 A1 | 3/2007 | Alden | |
| 2007/0138405 A1 | 6/2007 | Shirck | |
| 2008/0128397 A1 | 6/2008 | Gandhi | |
| 2008/0152943 A1 * | 6/2008 | Aurongzeb | H01K 1/14 428/639 |
| 2009/0233124 A1 * | 9/2009 | Berg | B82Y 10/00 428/689 |
| 2009/0322218 A1 | 12/2009 | Wang | |
| 2010/0270058 A1 | 10/2010 | Mahoney et al. | |
| 2010/0323523 A1 * | 12/2010 | Zhu | H01L 27/11521 438/694 |
| 2011/0088770 A1 | 4/2011 | Allemand | |
| 2011/0094651 A1 * | 4/2011 | Kuriki | H01L 31/022466 156/51 |
| 2013/0056244 A1 * | 3/2013 | Srinivas | G06F 3/041 174/250 |
| 2014/0035599 A1 * | 2/2014 | Shimata | G06F 3/044 324/658 |
| 2015/0009432 A1 * | 1/2015 | Katagiri | G06F 3/041 349/12 |

FOREIGN PATENT DOCUMENTS

| | | | | |
|---|---|---|---|---|
| JP | 2011-154940 | | 8/2011 | |
| KR | 2013 0000108 A | * | 1/2013 | .......... H01L 31/052 |
| WO | WO 2007-022226 | | 2/2007 | |
| WO | WO 2008-046058 | | 4/2008 | |
| WO | WO 2009-152146 | | 12/2009 | |
| WO | WO 2012-145157 | | 10/2012 | |
| WO | WO 2013-095971 | | 6/2013 | |

OTHER PUBLICATIONS

"The Future of ITO: Transparent Conductor and ITO Replacement Markets," NanoMarkets LC, Glen Ellen, VA, Mar. 2008, 5 pages.
De, "Silver Nanowire Networks as Flexible, Transparent, Conducting Films: Extremely High DC to Optical Conductivity Ratios," ACS Nano, 2009, vol. 3, No. 7, pp. 1767-1774.
Weast, "Handbook of Chemistry and Physics" 50th Ed., p. F-140 (1970).
International Search Report for PCT International Application No. PCT/US2013/039174, mailed on Aug. 8, 2013, 4 pages.
DisplaySearch 2008 Flexible Electronics and Displays Report, Sep. 2008, pp. 262-263.

* cited by examiner

US 9,711,263 B2

CORONA PATTERNING OF OVERCOATED NANOWIRE TRANSPARENT CONDUCTING COATINGS

BACKGROUND

Indium tin oxide (ITO) is widely used as the conductor in the transparent electrodes that are essential to the functioning of many different types of display devices. ITO has a number of drawbacks. These include brittleness, which can lead to handling difficulties on flexible substrates, and a high refractive index that can give rise to reflective losses in constructions utilizing ITO layers on polymer films. The latter is a particular problem for liquid crystal-based devices, in that reflective losses at the electrode/active layer interface can lead to decreases in transmission, in turn leading to lower contrast ratios and degradation of display performance. Furthermore, ITO films are generally deposited using vacuum processing, which can be problematical if expensive vacuum deposition equipment is not readily available. They also depend on the availability of indium metal, an expensive, limited, and potentially strategic resource. Thus, many flexible display devices could benefit from availability of alternative transparent conducting electrodes which are not based on ITO and can be prepared by roll-to-roll wet coating processing.

Silver has the highest bulk conductivity of any known material. Consequently, one class of coatings exhibiting great promise as a roll-coatable ITO replacement is silver nanowires. These materials can be coated from liquid dispersions using standard roll-to-roll coating methods such as slot die and gravure. Although such coatings can give excellent conductivity with high visible transmission and low haze, in some applications the oxidative and chemical instability of silver, particularly in nanowire form, can necessitate the use of a protective overcoat for the silver layer to protect it against mechanical, chemical, and environmental degradation and subsequent loss of conductivity properties.

SUMMARY

In an aspect, the present description includes a method comprising: providing a transparent electrically conductive film comprising: a transparent substrate; a composite layer comprising: an electrically conductive layer disposed on at least a portion of a major surface of the transparent substrate and comprising a plurality of interconnecting metallic nanowires; and a polymeric overcoat layer disposed on a portion of the electrically conductive layer, to provide a coated area of the electrically conductive layer; and patternwise exposing the coated area of the electrically conductive layer to a corona discharge to provide a patternwise exposed electrically conductive film comprising (1) an unexposed region of the coated region having a first electrical resistivity, and (2) an exposed region having a second electrical resistivity; wherein the exposed region is less electrically conductive than the unexposed region, and wherein there is a ratio of the second electrical resistivity over the first electrical resistivity of at least 1000:1.

Nanostructured films according to embodiments of the present description typically comprise interconnected network(s) of silver nanowires. Such network(s) are preferably substantially electrically conductive. Such films may additionally be optically transparent.

A film is said to be "transparent" when the layer or layers permit at least 80% of at least a portion of incident electromagnetic radiation from about 400 nm to about 700 nm to pass through the layer or layers.

A film is said to be "optically transparent" when it is substantially optically clear such that when viewing an object on an opposing side of the electrode, little or no distortion of the object is visually observed by an unaided eye with 20:20 vision.

"Electrically conductive region" refers to a region of a film having a sheet resistance of less than $10^4$ ohm per square.

"Electrically insulative" refers to a region between electrically conductive regions that shows a sheet resistance of at least $10^6$ ohm/sq.

These and other aspects of the invention are described in the detailed description below. In no event should the above summary be construed as a limitation on the claimed subject matter which is defined solely by the claims as set forth herein.

DETAILED DESCRIPTION

Figure 1:
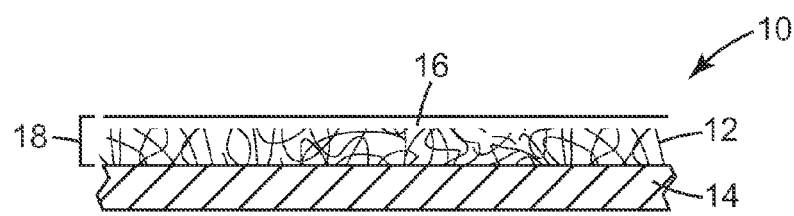
FIG. 1 is a cross-sectional view of an exemplary embodiment of an electrically conductive region of an electrically conductive film described herein.

FIG. 1 shows a cross-sectional view of an exemplary embodiment of a transparent electrode (i.e., transparent electrical conductor) 10 of the present disclosure, showing an electrically conductive regions thereof. Transparent electrode 10 comprises an electrically conductive layer 12 of interconnecting metallic nanowires disposed on at least a portion of a major surface of transparent substrate 14, and polymeric overcoat layer 16 is disposed on electrically conductive layer 12. Polymeric overcoat layer 16 and electrically conductive layer 12 together form composite layer 18 (i.e., a polymeric nanowire layer). Not shown in FIG. 1 is an electrically insulative region that separates the plurality of electrically conductive regions.

Figure 2:
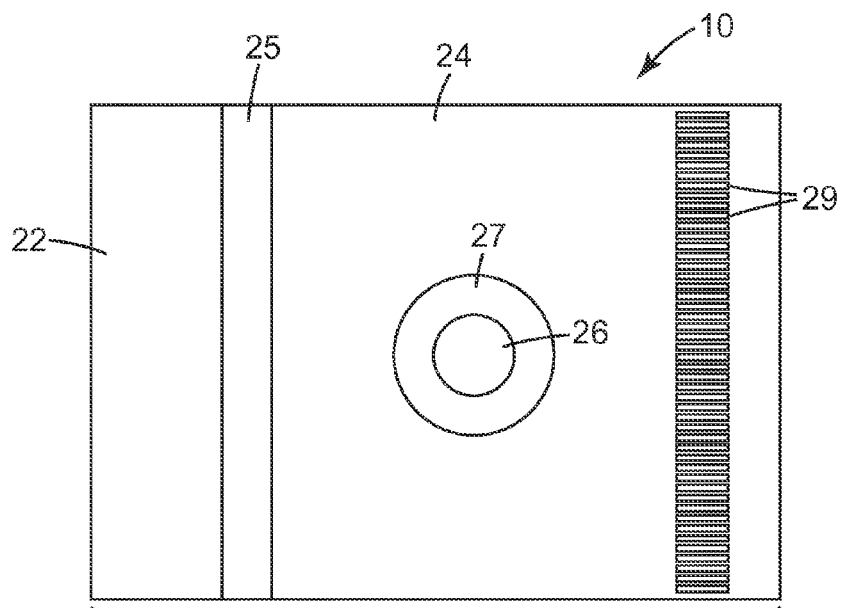
FIG. 2 is a plan view of an exemplary embodiment of a patternwise exposed transparent electrically conductive film described herein.

FIG. 2 shows a plan view of an exemplary embodiment of a transparent electrode (i.e., transparent electrical conductor) 10 of the present disclosure, showing composite layer 18, including electrically conductive regions 22, 24, and 26, and various electrically insulative regions 25, 27, and 29. Electrically insulative region 25 separates electrically conductive regions 22 and 24, and electrically insulative region separates electrically conductive regions 24 and 26. Electrically insulative regions 29 are separated from each other by electrically conductive region 24. Thus, a variety of patterns and combinations of electrically conductive regions and electrically insulative regions are contemplated in the current disclosure. In FIG. 2, lines are shown in order to represent different regions of the transparent electrode; however, in some embodiments the transparent electrode does not have visually discernable lines demarcating the electrically conductive regions and electrically insulative regions. In some other embodiments, the lines may be visually discernable.

In some embodiments, the insulative or conductive regions have features sizes with the smallest dimension on the order of about 1 mm. In some other embodiments, the insulative or conductive regions have features sizes with the smallest dimension on the order of about 2 mm, about 5 mm, or even about 10 mm. In some embodiments, haze values and light transmission values of insulative (i.e., corona-treated) regions can be the same as, higher than, or lower than those of the conductive (i.e., untreated) regions. Typically, the level of corona treatment is selected to keep the haze values and light transmission values at least within ±1% of the haze values and light transmission values for non-corona treated regions. In some embodiments, haze values and light transmission values following corona treatment may be substantially the same as (i.e., within ±0.5%) the corresponding haze values and light transmission values prior to corona treatment.

In some embodiments, transparent electrode 10 of the present disclosure is optically transparent. Transparent electrode 10 may be flexible such that it can be flexed without loss of electrically conductive properties, to provide a display that is conformable to a curved surface.

The electrically conductive regions of transparent electrodes of the present disclosure comprise a transparent substrate bearing a strip, plane or surface that is electrically conductive (sheet resistivity of less than about $10^4$ ohm/sq) and transmits radiation of at least some portion of the electromagnetic spectrum. In particular, the transparent electrode comprises: a transparent substrate, a conductive layer disposed on the transparent substrate and comprising metallic nanowires, a polymeric overcoat layer disposed on the conductive layer and optionally comprising nanoparticles selected from the group consisting of antimony tin oxide, zinc oxide and indium tin oxide, wherein a sheet resistance of the polymeric overcoat layer disposed on the transparent substrate without the conductive layer is greater than about $10^7$ ohm/sq.

In some embodiments, a transparent electrode of the present disclosure can be used in display applications in which optical performance requires low haze and high visible light transmission. For example, such a display comprises: (a) a first electrode comprising the transparent electrode, wherein the transparent substrate comprises a first substrate; (b) a second electrode comprising a second substrate; and (c) image forming material disposed between the polymeric overcoat layer and the second electrode. In some embodiments, the second substrate is transparent, and in some embodiments the first electrode and second electrode can be made from the same material. In some embodiments, the second substrate is opaque. Exemplary displays in which the transparent electrode may be used include polymer-dispersed liquid crystal displays, liquid crystal displays, electrophoretic displays, electrochromic displays, electroluminescent displays and plasma displays.

Transparent electrodes made with silver as the conductive material are known. Silver can be utilized as a transparent conductive material when used in the form of silver nanowires, meshes or lines, as described in WO 2008/046058 (Allemand et al.). Although silver coatings provide excellent conductivity with high visible light transmission and low haze, in some applications the oxidative and chemical instability of silver, particularly in nanowire form, can necessitate the use of a protective overcoat for the silver layer. The protective overcoat can protect the silver from mechanical damage and environmental degradation which can lead to loss of conductivity of the silver.

Protective overcoats for silver include those having insulating electrical properties. A protective overcoat is considered to have insulating electrical properties if a coating of the protective overcoat on the substrate, without the silver nanowires, has a sheet resistance greater than about $10^{12}$ ohm/sq. Materials such as UV-curable acrylic resins have insulating properties and are particularly useful for making protective overcoats.

Protective overcoats for silver include those having conducting properties. A protective overcoat is considered to have conducting properties if a coating of the protective overcoat on the substrate, without the silver nanowires, has a sheet resistance less than about $10^4$ ohm/sq. Materials useful for making a protective overcoat having conducting properties include various types of vacuum-applied coatings comprising ITO, but this approach is not advantageous for reasons described above for ITO itself. Conducting protective overcoats can also include conducting polymers but these materials absorb strongly in the visible region. For example, poly(3,4-ethylenedioxythiophene) poly(styrene sulfonate) (often referred to as PEDOT/PSS) is widely used yet it is deep blue. Conducting polymers such as PEDOT/PSS, other polythiophenes, and polyanilines can also be used as overcoats applied so as to give overcoat sheet resistance up to $10^9$ ohm/sq. Such overcoats are particularly useful in OLED device constructions.

In some embodiments, the transparent electrode exhibits little or no haze, meaning it may have a haze value not greater than about 10% (in some embodiments, not greater than about 5%, or even not greater than about 2%). For light normally incident on the transparent electrode, the haze value is the ratio of transmitted light intensity that deviates from the normal direction by more than 4 degrees to the total transmitted light intensity. Haze values disclosed herein were measured using a haze meter (available from BYK-Gardiner, Silver Springs, Md., under the trade designation "HAZE-GARD PLUS") according to the procedure described in ASTM D1003.

In some embodiments, the transparent electrode has high light transmittance of from about 80% to about 100% (in some embodiments, from about 90% to about 100%, from about 95% to about 100%, or even from about 98% to about 100%) over at least a portion of the visible light spectrum (about 400 to about 700 nm). In some embodiments, the transparent electrode has a high light transmittance of at least about 80%, from about 90% to about 100%, or from about 90% to about 95% over at least a portion of the visible light spectrum (about 400 to about 700 nm), and a haze value from about 0.01% to less than about 5%.

The conductive layer comprises metallic nanowires which have an aspect ratio greater than about 10, the aspect ratio being determined by dividing the length of the particles by their diameter. As used herein, metallic nanowire refers to a metallic wire comprising metal, metal alloys or metal compounds including metal oxides. At least one cross-sectional dimension of the metallic nanowire is less than 500 nm (in some embodiments, less than 200 nm or even less than 100 nm). The aspect ratio is greater than about 10, greater than about 50, greater than about 100 or from about 10 to about 10,000. Metallic nanowires can comprise any metal including silver, gold, copper, nickel, nickel-plated copper, and gold-plated silver. In one embodiment, the metallic nanowires comprise silver nanowires as described, for example, in WO 2008/046058 (Allemand et al.). Silver nanowires can be prepared as described in WO 2008/046058 or obtained from commercial sources (e.g., Blue Nano, Charlotte, N.C.; Seashell, La Jolla, Calif.; and Nanogap USA, San Francisco, Calif.).

The metallic nanowires form a conductive network on the surface of the transparent substrate. In general, a dispersion of the metallic nanowires in some solvent is prepared and coated on the transparent substrate, followed by drying the coating to remove the solvent. Any solvent that forms a stable dispersion with the metallic nanowires can be used, for example, water, alcohols, ketones, ethers, hydrocarbons, aromatic hydrocarbons, and compatible mixtures thereof. The dispersion comprising the metallic nanowires can comprise additives typically used in coating formulations (e.g., surfactants, binders, materials for controlling viscosity, and corrosion inhibitors). Optimization of dispersion formulations and coating and drying conditions is described in WO 2008/046058 (Allemand et al.).

In general, the thickness of the conductive layer depends upon the particular metallic nanowires being used, properties of the polymeric overcoat layer, and the imaging material. In most cases, it is desirable to minimize the amount of metallic nanowires used in order to minimize cost and any adverse effects on the performance of the display. The conductive layer may comprise a variety of components in addition to the metallic nanowires. In one embodiment, the conductive layer consists essentially of the metallic nanowires. In another embodiment, the conductive layer comprises greater than about 40 wt % of the metallic nanowires, with the remaining wt % comprising additives such as binders and surfactants.

The thickness of the conductive layer is typically less than about 500 nm. In some embodiments, the conductive layer is in the form of a mesh or network of nanowires or in some discontinuous form across a surface of the transparent substrate. In some embodiments, the metallic nanowires are disposed on the transparent substrate such that they form a pattern comprising transparent conductive regions and transparent non-conductive regions. An exemplary pattern comprises an array of lines or discrete conductive regions spaced apart from each other by about 50 micrometers to about 500 micrometers or more.

Typically, the particular metallic nanowires used and the thickness of the conductive layer is determined by the desired sheet resistance of the layer disposed on the transparent substrate. The typical range of sheet resistance is from about 10 ohm/sq to about 5000 ohm/sq, with preferred ranges depending on the particular device and application. For organic light-emitting diode (OLED) devices, a typical sheet resistance is from about 10 to about 50 ohm/sq; for PDLC and cholesteric liquid crystal devices, typical sheet resistance is from about 50 to about 250 ohm/sq; and for electrophoretic display devices, typical sheet resistance is from about 50 to about 2000 ohm/sq.

Sheet resistance of the conductive layer can be measured by contact and non-contact methods. For the contact method, a two-point probe comprising two metal contacts connected to a voltmeter is placed on the conductive layer such that the probe is in contact with layer. For the non-contact method, an instrument having a contactless probe may be used (e.g., the instrument available from Delcom Products Inc., Prescott, Wis., under the trade designation "DELCOM 717B NON-CONTACT CONDUCTANCE MONITOR").

The transparent electrode can be used in different types of displays as described below. In some displays, the transparent electrode needs to be designed such that light is transmitted through the electrode and toward the viewer. In these cases, the components and thickness of the conductive layer need to be selected such that optical properties of the layer meet certain requirements.

The polymeric overcoat layer is disposed on the conductive layer such that the metallic nanowires are protected from adverse environmental factors such as corrosion and abrasion. In particular, the polymeric overcoat layer may be designed to prevent or at least minimize the permeability of corrosive elements, such as moisture, trace amounts of acid, oxygen, and sulfur-containing contaminants such as hydrogen sulfide or alkylthiols.

In general, the polymeric overcoat layer is formed from organic components which may or may not be pre-polymerized. The organic components are not particularly limited as long as the polymeric overcoat layer can be formed on the conductive layer, and the conductive layer is protected from corrosion and abrasion yet can function as desired in the resulting display.

In some embodiments, the polymeric overcoat layer is formed from a polymerizable formulation comprising one or more polymerizable components such as monomers which can include small molecules having a molecular weight less than about 500 g/mole, oligomers having a molecular weight of greater than 500 g/mole to about 10,000 g/mole, and polymers having a molecular weight of greater than 10,000 g/mole to about 100,000 g/mole. The polymerizable monomers or oligomers can be cured using actinic radiation (e.g., visible light, ultraviolet radiation, electron beam radiation, heat and combinations thereof), or any of a variety of conventional anionic, cationic, free radical, or other polymerization techniques, which can be photochemically, thermally, or redox initiated.

Representative examples of polymerizable groups suitable for forming the polymeric overcoat layer include epoxy groups, ethylenically unsaturated groups, allyloxy groups, (meth)acrylate groups, (meth)acrylamide groups, cyanoester groups, vinyl ether groups, and combinations thereof. The monomers may be mono- or multifunctional and capable of forming a crosslinked network upon polymerization. As used herein, (meth)acrylate refers to acrylate and methacrylate, and (meth)acrylamide refers to acrylamide and methacrylamide.

Useful monofunctional monomers include styrene, alpha-methylstyrene, substituted styrenes, vinyl esters, vinyl ethers, N-vinyl-2-pyrrolidone, (meth)acrylamide, N-substituted (meth)acrylamides, octyl (meth)acrylate, iso-octyl (meth)acrylate, nonylphenol ethoxylate (meth)acrylate, isononyl (meth)acrylate, diethylene glycol mono(meth)acrylate, isobornyl (meth)acrylate, 2-(2-ethoxyethoxy)ethyl (meth)acrylate, 2-ethylhexyl (meth)acrylate, lauryl (meth)acrylate, butanediol mono(meth)acrylate, beta-carboxyethyl (meth)acrylate, isobutyl (meth)acrylate, cycloaliphatic epoxides, 2-hydroxyethyl (meth)acrylate, (meth)acrylonitrile, maleic anhydride, itaconic acid, isodecyl (meth) acrylate, dodecyl (meth)acrylate, n-butyl (meth)acrylate, methyl (meth) acrylate, hexyl (meth)acrylate, (meth)acrylic acid, N-vinylcaprolactam, stearyl (meth)acrylate, hydroxyl functional polycaprolactone ester (meth) acrylate, hydroxypropyl (meth)acrylate, hydroxyisopropyl (meth)acrylate, hydroxybutyl (meth)acrylate, hydroxyisobutyl (meth)acrylate, tetrahydrofurfuryl (meth)acrylate, and combinations thereof.

Suitable high molecular weight constituents comprising polymerizable oligomers and polymers may be incorporated into the polymeric overcoat layer for providing durability, flexibility, adhesion to the conductive layer and/or transparent substrate, weatherability, and permeability. These high molecular weight constituents may also be useful for obtaining a suitable coating formulation for forming the polymeric overcoat layer, for example, they may be used to provide viscosity control or reduce shrinkage of the layer upon curing. The oligomers and/or polymers themselves may be straight-chained, branched, and/or cyclic. Branched oligomers and/or polymers tend to have lower viscosity than straight-chain counterparts of comparable molecular weight.

Exemplary polymerizable oligomers and polymers include aliphatic polyurethanes, (meth)acrylates, polyesters, polyimides, polyamides, epoxy polymers, polystyrene (including copolymers of styrene) and substituted styrenes, silicone-containing polymers, fluorinated polymers, and combinations thereof. For some applications, polyurethane (meth)acrylate oligomers and/or polymers can have improved durability and weatherability characteristics. Such materials also tend to be readily soluble in reactive diluents formed from radiation curable monomers, particularly (meth)acrylate monomers. Exemplary polymerizable oligomers and polymers include combinations of the above-described functionalities such as urethane (meth)acrylates, epoxy (meth)acrylates, polyester (meth)acrylates, polyether (meth)acrylates, (meth)acrylated (meth)acrylics, (meth)acrylated silicones, vinyl (meth)acrylates, and (meth)acrylated oils.

The polymeric overcoat layer can also be formed from organic components which are not polymerizable, particularly polymers which are simply combined with other overcoat components in some aqueous and/or organic solvent-based formulation and coated over the conductive layer, followed by removal of any volatiles to form the polymeric overcoat layer. Exemplary polymers include poly(meth) acrylates, polystyrenes, polyurethanes, polythiophenes, polyanilines, polypyrroles, poly(vinylalcohol) copolymers and polyesters.

Particular examples of monofunctional monomers include those described above. Particular examples of multifunctional monomers include pentaerythritol triacrylate (available from Sartomer Co., Exton, Pa., under the trade designation "SR 444C"), hexanediol diacrylate, urethane acrylate oligomers (including, e.g., those oligomers available from Sartomer Co., under the trade designation "CN 981 B88", and from Cytec Industries, Wallingford, Conn., under the trade designations "UCECOAT 7655" AND "UCECOAT 7689").

Particular examples of preformed polymers include polymethylmethacrylates (including those polymethylmethacrylates available from Lucite International, Inc. under the trade designation "ELVACITE 2041"), polystyrenes, polythiophenes (including those polythiophenes available from Plextronics, Inc., Pittsburgh, Pa., under the trade designations "PLEXCORE OC RG-1100" and "PLEXCORE OC RG-1200"), and polyvinylbutyrals (including those polyvinylbutyrals available from Solutia Inc., St. Louis, Mo., under the trade designation "BUTVAR").

In some embodiments, the polymeric overcoat layer comprises the reaction product of a multifunctional (meth) acrylate. For example, the polymeric overcoat layer may comprise a methyl (meth)acrylate polymer and the reaction product of a multifunctional (meth)acrylate. For another example, the polymeric overcoat layer may comprise the reaction product of a multifunctional (meth)acrylate and a urethane (meth)acrylate oligomer.

The polymeric overcoat layer may also comprise nanoparticles having a diameter of less than about 500 nm (in some embodiments, from about 10 nm to about 500 nm, or even from about 40 nm to about 200 nm), and selected from the group consisting of antimony tin oxide, zinc oxide, indium tin oxide, and combinations thereof. These metal oxide nanoparticles can be prepared by hydrothermal synthetic methods or obtained from commercial sources (e.g., Advanced Nano Products, Korea; Sukgyung AT Inc., Des Plaines, Ill.; and Evonik Degussa Corp., Parsippany, N.J.).

The polymeric overcoat layer comprises the organic components and nanoparticles in any relative amount as long as the desired properties and performance of the layer are obtained. In some embodiments, the weight ratio of organic components to nanoparticles may be from about 85:15 to about 25:75, and even in some embodiments from about 75:25 to about 40:60.

The thickness of the polymeric overcoat layer is not particularly limited as long as the layer protects the metallic nanowires from corrosion and abrasion, and the desired properties and performance of the layer are obtained. In some embodiments, the thickness of the polymeric overcoat layer is less than about 1 micrometer, from about 50 nm to about 1 micrometer, and even in some embodiments from about 200 nm to about 400 nm. In some exemplary embodiments, the polymeric overcoat layer may be disposed on the conductive layer such that portions of the metallic nanowires protrude from the surface of the polymeric overcoat layer to enable access to the conductive layer. In some embodiments, the metallic nanowires do not protrude from the surface of the polymeric overcoat layer, and the conductive layer is accessed through an opening in the polymeric overcoat or an opening at an edge of the transparent electrode. In some embodiments, the metallic nanowires do not protrude from the surface of the polymeric layer, and the conductive layer is accessed through thin portions of the polymeric overcoat layer.

In general, the particular components and amounts, layer thickness, etc. of the polymeric overcoat layer will depend upon a number of factors, for example, the chemistry of the organic components, the nanoparticles, the metallic nanowires being used, the amount of metallic nanowires present in the conductive layer, the thickness of the conductive layer, the imaging material and the type of display in which the transparent electrode is used.

In some embodiments, the polymeric overcoat layer comprises an optically clear layer having high light transmittance of from about 80% to about 100% (in some embodiments, from about 90% to about 100%, from about 95% to about 100%, or even from about 98% to about 100%), over at least a portion of the visible light spectrum (about 400 nm to about 700 nm). In some embodiments, the polymeric overcoat layer has a haze value of less than about 5% (in some embodiments, less than about 3%, or even less than about 1%). In some embodiments, the polymeric overcoat layer has a haze value of from about 0.1 to less than about 5% (in some embodiments, from about 0.1 to less than about 3%, or even from about 0.1 to less than about 1%).

The polymeric overcoat layer is selected depending on the desired properties of the layer, the transparent electrode, and the display into which it is incorporated. The coating formulation for the polymeric overcoat layer is coated directly on the transparent substrate without the conductive layer, and curing, drying etc. are carried out to form the polymeric overcoat layer. Performance of the polymeric overcoat layer is then determined by measuring the sheet resistance of the coated transparent substrate. A sheet resistance of the polymeric overcoat layer disposed on the transparent substrate without the conductive layer should be greater than about $10^7$ ohm/sq. In some embodiments, the sheet resistance is from about $10^7$ ohm/sq to about $10^{12}$ ohm/sq. For a given polymeric overcoat layer, the sheet resistance can be varied by changing the thickness of the layer, and the layer can be as thin as desired, as long as the metallic nanowires are protected from corrosion and abrasion. Sheet resistance of the polymeric overcoat layer can be measured by contact and non-contact methods as described above.

In some embodiments, the transparent substrate is substantially optically clear such that when viewing an object on an opposing side of the substrate, little or no distortion of the object is observed, or some acceptable level of distortion is observed. In some embodiments, the transparent substrate exhibits little or no haze, meaning it may have a haze value not greater than about 10%, not greater than about 5% or not greater than about 2%. In some embodiments, the transparent substrate has high light transmittance of from about 80% to about 100% (in some embodiments, from about 90% to about 100%, from about 95% to about 100%, or even from about 98% to about 100%) over at least a portion of the visible light spectrum (about 400 nm to about 700 nm). In some embodiments, the transparent substrate has a high light transmittance of at least about 80% (in some embodiments, from about 90% to about 100%, or even from about 90% to about 95%) over at least a portion of the visible light spectrum (about 400 nm to about 700 nm), and a haze value from about 0.1% to less than about 5%. The transparent substrate can be reflective, antireflective, polarizing, non-polarizing, colored (transmissive to particular wavelengths of light) or combinations thereof.

The transparent substrate can comprise any useful material such as, for example, polymer, glass, crystalline ceramic, glass-ceramic, metal, metal oxide, or combinations thereof. Examples of polymers that may be used as the transparent substrate include thermoplastic polymers (e.g., polyolefins, poly(meth)acrylates, polyamides, polyimides, polycarbonates, polyesters, and biphenyl- or naphthalene-based liquid crystal polymers). Further examples of useful thermoplastics include polyethylene, polypropylene, polystyrene, poly(methylmethacrylate), bisphenol A polycarbonate, poly(vinyl chloride), polyethylene terephthalate, poly-ethylene naphthalate, polyethersulfone, cellulose acetates and poly(vinylidene fluoride). Some of these polymers also have optical properties (e.g., transparency) that make them especially well-suited for certain display applications wherein they would support a patterned conductor (e.g., polycarbonates, polyimides, polyesters, and combinations thereof).

The transparent substrate may have any useful thickness, ranging from about 5 micrometers to about 1000 micrometers (in some embodiments, from about 25 micrometers to about 500 micrometers, from about 50 micrometers to about 250 micrometers, or even from about 75 micrometers to about 200 micrometers). In embodiments where the transparent substrate is glass, the thickness can be up to 250 micrometers or greater.

The transparent substrate can be flexible such that it can be flexed or wound around a cylindrical mandrel of specified diameter without cracking or breaking. The transparent substrate may be rigid. In some embodiments, the transparent substrate has sufficient mechanical properties such as strength and flexibility to be processed on a roll-to-roll apparatus wherein a material is wound onto or unwound from a support, as well as further processed in some way. Examples of further processing include coating, slitting, laminating, and exposing to radiation.

Figure 3:
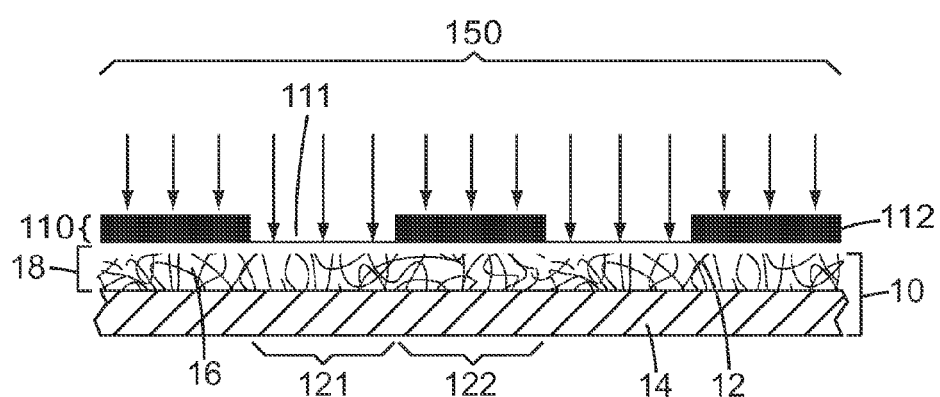
FIG. 3 illustrates an exemplary embodiment of a method of the present disclosure to provide a patternwise exposed transparent electrically conductive film.

FIG. 3 shows an exemplary embodiment of corona discharge 150 being applied through a patterned mask 110 in contact with transparent electrode 10, mask 110 having transmitting region(s) 111 and non-transmitting region(s) 112. Non-transmitting region(s) 112 blocks exposure of transparent electrode 10 to corona discharge 150. Electrically conductive layer 12 is thus patternwise exposed through patterned mask 110 to provide a patternwise exposed electrically conductive film having an unexposed region 122 having a first electrical resistivity, and an exposed region 121 having a second electrical resistivity.

Figure 4:
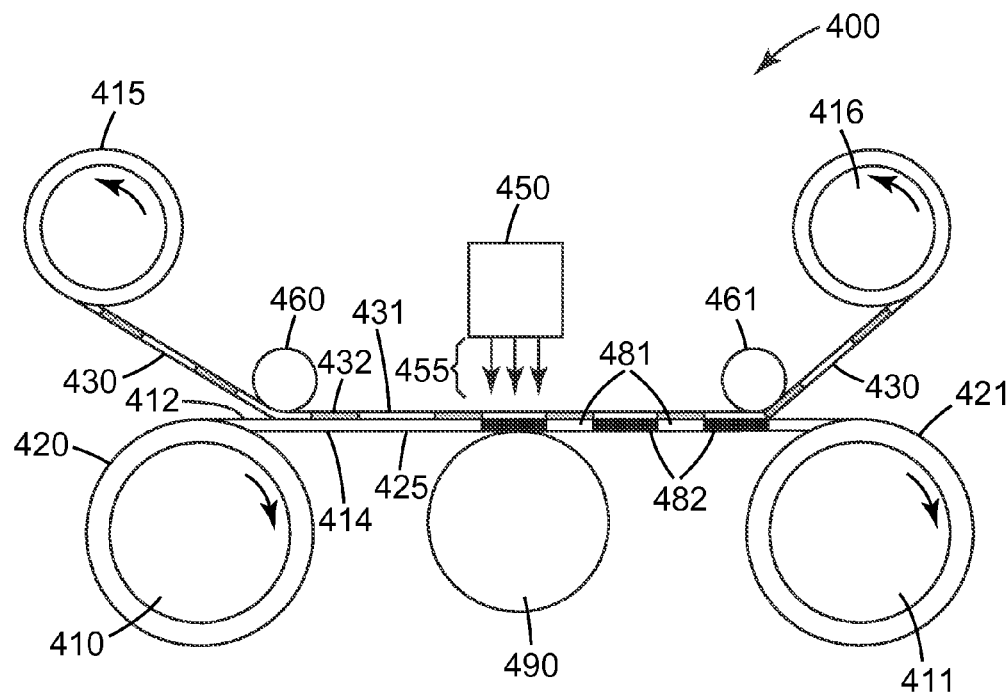
FIG. 4 illustrates an exemplary embodiment of a method of the present disclosure to provide a patternwise exposed transparent electrically conductive film.

FIG. 4 illustrates a method for providing patternwise corona treatment of a transparent electrically conductive film. Apparatus 400 includes a supply roll 410 supplying transparent electrically conductive film 420 and another supply roll 415 supplying mask film 430 including transparent region(s) 431 and opaque region(s) 432. Films 420 and 430 are brought together at roll 460, forming laminate 425 that passes under corona treatment source 450 and over grounding roll 490. Transparent substrate 414 faces away from corona treatment source 450, and electrically conductive layer 412 faces towards corona treatment source 450. Corona discharge 455 passes through transparent region(s) 431 of mask film 430 to expose composite layer 418 of transparent electrically conductive film 420 to corona discharge, forming transparent electrically conductive film 421 having exposed region(s) 482 that are less electrically conductive than unexposed region(s) 481. The two films 421 and 430 are separated at roll 461 and wound onto takeup rolls 411 and 416, respectively.

Figure 5:
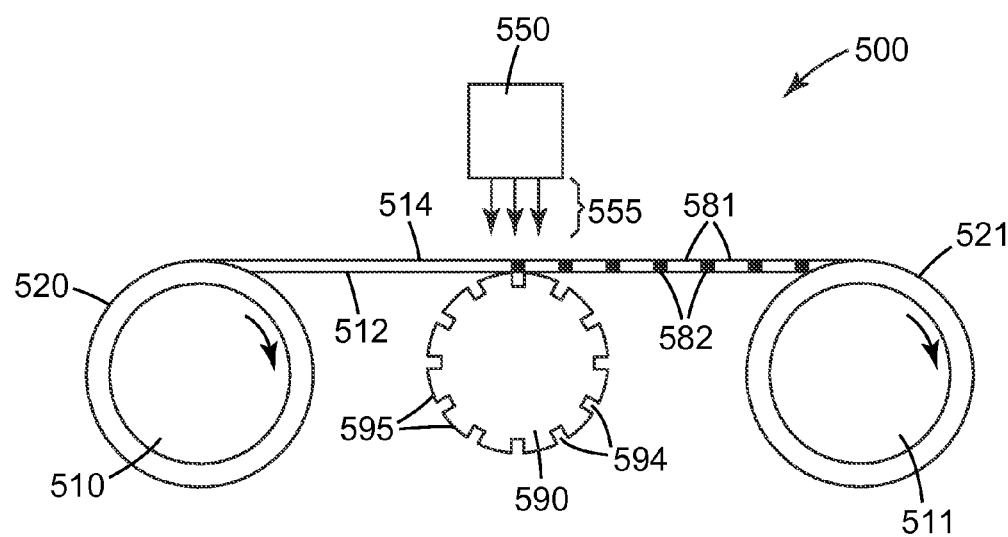
FIG. 5 illustrates an exemplary embodiment of a method of the present disclosure to provide a patternwise exposed transparent electrically conductive film.

FIG. 5 illustrates an alternate configuration for providing patternwise corona treatment of a transparent electrically conductive film. Apparatus 500 includes supply roll 510 supplying transparent electrically conductive film 520. Transparent electrically conductive film 520 passes under corona treatment source 550 and over patterned grounding roll 590, with electrically conductive layer 512 facing towards patterned grounding roll 590 and transparent substrate 514 facing away from patterned grounding roll 590. Corona discharge 555 occurs in recessed region(s) 594 of grounding roll 590 to expose transparent electrically conductive film 520 to corona discharge that is contained within recessed regions 594 of grounding roll 590, forming transparent electrically conductive film 521 having exposed region(s) 582 that are less electrically conductive than unexposed region(s) 581. Regions of transparent electrically conductive film 520 that pass over non-recessed region(s) 595 of patterned grounding roll 590 are not exposed to corona discharge 555 on the side of the film in contact with grounding roll 590. Patterned films 521 is then wound onto takeup roll 511.

The transparent substrate can include multiple layers of material such as a support layer, a primer layer, a hard coat layer, or a decorative design. The transparent substrate can be permanently or temporarily attached to an adhesive layer. For example, the transparent substrate can have an adhesive layer on a major surface thereof, and a release liner can be disposed on the adhesive layer and removed for attachment of the adhesive layer to another substrate.

In some embodiments, corona discharge can be produced by equipment that includes a high-frequency power generator, a high-voltage transformer, a stationary electrode, and a treater ground roll or drum.

In some embodiments, patterned corona treatment, and thus patternwise modification of the substrate can be accomplished by masking portions of the radiation so that the corona discharge only effects certain portions of the electrically conductive film.

Patterned corona treatment has been disclosed, for example, in U.S. Pat. Nos. 4,879,430 and 5,139,804 (Hoffman). Using this process, an applicator roll or drum is provided that has patterns recessed into it by, for example, engraving. A polymeric web, such as a polyolefinic web, can be passed over the roll and simultaneously exposed to a corona discharge from the top side, away from the roll. The corona discharge can modify the surface of the top side of the web unselectively, meaning without any pattern. On the backside of the web (the side facing the roll), the recessed patterns can allow for the entrapment of air where there is no contact with the applicator roll. This entrapped air can be activated by the corona treatment and can create a patternwise surface modification on the underside of the web in the areas exposed to discharges in the entrapped air.

It will be understood that in addition to the corona treatments described herein, other methods of generating ionized gases to provide a patternwise exposed electrically conductive film can include, for example, plasma treatment. Plasma treatment typically uses partially ionized inert gases (for example, argon, neon, krypton, or xenon), air, water, or hydrogen, and can be used to create free radicals on a polymeric substrate.

Also useful in one embodiment of the provided method are tapes having a thickness in the range of about 125 μm to about 500 μm to pattern mask the applicator roll, such as those in the recited patents by Hoffman. A wide variety of tapes may be used, including, for example, polyimide, polyolefin, cellulose, or vinyl tapes. In some embodiments it has been found to be practical to use thin, flexible polymeric masks in forming a patterned corona irradiation. It has been found, for example, that a thin, flexible polytetrafluoroethylene ("PTFE") film can be easily cut to a pattern and placed on the roll so as to create patterned pockets that will result in surface modification that includes a pattern upon wrapping the substrate around the roll and exposing the web to corona treatment. In a further embodiment, an adhesive can be positioned between the polymeric mask material and the conductive layer. Commercially available tapes having an adhesive layer disposed on a backing layer can be used, including, for example, "3M 8403" pressure sensitive adhesive tape available from 3M Company, St. Paul, Minn. (see Example 1).

In some embodiments, the pattern can be in the form of a closed loop. This loop may be circular, oval, elliptical, polygonal, or irregular. In some embodiments the pattern can be a closed loop with a circular pattern and can form a ring or annulus. It is also possible that the pattern is not a complete loop but has some breaks in it and consists therefore of segments of a closed loop. For example, the pattern can be in the shape of a ring or an annulus but be made up of a number of pattern corona-treated dots, segments, X's, or a collection of any small shaped treated areas that are arranged in the shape of a closed loop.

The depth over which corona treatment energy is absorbed, and thus the amount of nanostructured film material removed or modified by a single corona treatment may depend on the materials' (i.e., the transparent conducting thin film and/or the substrate) physical (both optical and mechanical) properties and the level of the corona treatment energy.

In some embodiments, patternwise exposing the electrically conductive layer to the corona discharge comprises chemically or physically transforming portions of the metallic nanowires to electrically insulative regions. While we do not wish to be bound by any particular theory, the mechanism by which conductivity is lost in the corona-treated regions appears to involve ablation of the overcoat material by the corona discharge, leaving "nanotrenches" through which the silver nanowires can be rendered nonconductive, either by oxidation or by scission, or by ablation and resulting redeposition of the silver thus destroying the nanowire structure and reducing conductivity. In some embodiments, the nanotrenches have dimensions of 100-200 nanometers deep, and up to approximately 1 micrometer in width.

Embodiments

Item 1. A method comprising:
  providing a transparent electrically conductive film comprising:
    a transparent substrate;
    a composite layer comprising:
      an electrically conductive layer disposed on at least a portion of a major surface of the transparent substrate and comprising a plurality of interconnecting metallic nanowires; and
      a polymeric overcoat layer disposed on a portion of the electrically conductive layer, to provide a coated area of the electrically conductive layer; and
  patternwise exposing the coated area of the electrically conductive layer to a corona discharge to provide a patternwise exposed electrically conductive film comprising (1) an un exposed region of the coated area having a first electrical resistivity, and (2) an exposed region having a second electrical resistivity;
  wherein the exposed region is less electrically conductive than the unexposed region, and wherein there is a ratio of the second electrical resistivity over the first electrical resistivity of at least 1000:1.

Item 2. The method of item 1, wherein the patternwise exposing comprises exposing the coated area of the electrically conductive layer to the corona discharge through a patterned mask.

Item 3. The method of item 2, wherein the patterned mask is laminated to the coated area of the electrically conductive layer.

Item 4. The method of any one of items 2 to 3, further comprising removing the patterned mask from the unexposed region.
Item 5. The method of item 1, wherein the patternwise exposing comprises contacting the coated area of the electrically conductive layer to a patterned surface of a corona discharge treatment roller.
Item 6. The method of item 1, wherein the patternwise exposing comprises contacting the coated area of the electrically conductive layer to a patterned surface of a corona discharge treatment belt.
Item 7. The method of any preceding item, wherein the plurality of interconnecting metallic nanowires comprises silver nanowires.
Item 8. The method of any preceding item, wherein the exposed region and the unexposed region have substantially the same haze values.
Item 9. The method of any preceding item, wherein the exposed region and the unexposed region have substantially the same transmission values.
Item 10. The method of any preceding item, wherein the patternwise exposed electrically conductive film is optically clear.
Item 11. The method of any preceding item, wherein patternwise exposing the electrically conductive layer to the corona discharge comprises chemically or physically transforming portions of the metallic nanowires to electrically insulative regions.
Item 12. The method of any one of items 1 to 11, wherein the exposed region has a width that is at least 100 micrometers.
Item 13. The method of any one of items 1 to 11, wherein the exposed region has a width that is at least 1 millimeter.
Item 14. The method of any one of items 1 to 11, wherein the exposed region has a width that is at least 10 millimeters.
Item 15. The method of any one of items 1 to 11, wherein the exposed region has a width that is at least 100 millimeters.
Item 16. The method of any one of items 1 to 11, wherein the exposed region has a width that is at least 1 centimeter.
Item 17. The method of any one of items 1 to 11, wherein the exposed region has a width that is at least 10 centimeters.
Item 18. The method of any one of items 1 to 11, wherein the exposed region has an area that is at least 1 cm$^2$.
Item 19. The method of any one of items 1 to 11, wherein the exposed region has an area that is at least 10 cm$^2$.
Item 20. The method of any one of items 1 to 11, wherein the exposed region has an area that is at least 100 cm$^2$.

Advantages and embodiments of this invention are further illustrated by the following examples, but the particular materials and amounts thereof recited in these examples, as well as other conditions and details, should not be construed to unduly limit this invention. All parts and percentages are by weight unless otherwise indicated.

EXAMPLES

Transmission, Haze, and Sheet Resistance Measurements

Unless otherwise indicated, transmission and haze values were measured using a haze meter (obtained from BYK-Gardner USA, Columbia Md., under the trade designation "HAZE-GARD PLUS"), and sheet resistance was measured using a contactless resistance probe (obtained from Delcom Instruments Inc., Prescott, Wis., under the trade designation "MODEL 717B"). As indicated, for some instances, sheet resistance was also measured using a 2-point probe and a voltmeter. This 2-point probe method was used to confirm loss of conductivity in corona-exposed areas too small to measure using the Delcom probe (such area typically on the order of a square less than about 5 cm on a side).

Atomic Force Microscopy ("AFM"), in Tapping Mode

Transparent electrodes of the current description were analyzed with an atomic force microscopy ("AFM") instrument (obtained from Veeco Instruments, Inc., Santa Barbara, Calif., under the trade designation "VEECO DIMENSION 3100", including a "NANOSCOPE V" controller). The probes used were Olympus etched silicon probes ("OTESPA" probes, 1 Ωcm Silicon material), with a nominal force constant of 42 Newton/meter and a nominal resonance frequency of 300 kiloHertz. The data was analyzed using analysis software (from Bruker Nano, Inc., Santa Barbara, Calif., under the trade designation "NANOSCOPE ANALYSIS"). The images were flattened ($0^{th}$ order to remove z-offset between scan lines) and/or plane-fitted ($1^{st}$ order) to remove sample tilt. For AFM images (e.g., FIGS. 6, 7A, 7B, 8, 9A, 9B, 10, 11A, and 11B), a lighter area represented a z-axis value above the mean x-y plane of the sample, while a darker area represented a z-axis value below the mean x-y plane of the sample. For AFM profiles (e.g., in FIGS. 7C, 9C, and 11C), the origin of the z-axis was assigned coincident with the mean height of all z-values of the height images within the profile analysis dataset. For the AFM images in FIGS. 6, 7A, 8, 9A, 10, and 11A, the imaged area was 70 micrometers×70 micrometers (1024×1024 data points) in the x-y plane of the sample.

Materials

Materials used in the following examples are described in Table 1. All materials were used as received.

TABLE 1

| | |
|---|---|
| ATO Sol | Nominal 30 wt % antimony tin oxide (ATO) nanoparticles in isopropyl alcohol (obtained from Advanced Nano Products, Korea) |
| ELVACITE 2041 | Methyl methacrylate polymer (obtained from Lucite International, Inc., Memphis, TN, under the trade designation "ELVACITE 2041") |
| FC-4430 | Fluorocarbon surfactant (obtained from 3M Co., St. Paul, MN, under the trade designation "FC-4430"), |
| IRGACURE 651 | Photoinitiator (obtained from Ciba Specialty Chemicals, Tarrytown, NY, under the trade designation "IRGACURE 651") |
| MELINEX 618 | Polyethylene terephthalate film, 5 mil (0.13 mm) gauge (obtained from DuPont Teijin Films, Wilmington, DE, under the trade designation "MELINEX 618") |
| METHOCEL E4M | Hydroxypropylmethylcellulose (obtained from Dow Chemical, Midland, MI, under the trade designation "METHOCEL E4M") as 2.5 percent by weight solution in deionized water |
| SLV-NW-60 | Silver nanowire (obtained from Blue Nano, Charlotte, NC, under the trade designation "SLV-NW-60") as 1.32 percent by weight dispersion in ethanol |
| SR444C | Pentaerythritol triacrylate (obtained from Sartomer Co., Exton, PA, under the trade designation "SR444C") |
| VP ADNANO LRC | UV curable coating solution with ITO nanoparticles (obtained from Evonik Degussa Corp., Parsippany, NJ, under the trade designation "VP ADNANO LRC") as 16% total solids |

Preparation of Overcoat Compositions OC-1 and OC-2

Overcoat compositions were prepared as described in pending U.S. Provisional Patent Application 61/475,860 (Pellerite et al., filed on Apr. 15, 2011), which is incorporated herein by reference in its entirety.

Preparation of Overcoat Composition "OC-1"

A concentrate was prepared by dissolving an 85:15 weight-to-weight ("w/w") mixture of SR444C and ELVAC- ITE 2041 in acetone to 10 wt % total solids. IRGACURE 651 was added at 0.2 wt % total solids. Coating solutions at 3 wt % solids were obtained by dilution into 1:1, by weight, isopropyl alcohol:diacetone alcohol.

Preparation of Overcoat Composition "OC-2"

VP ADNANO LRC was diluted to 5 wt % total solids in 1:1 isopropyl alcohol:diacetone alcohol immediately before use.

Preparation of Overcoat Composition "OC-3"

A widemouth screwtop jar was charged with 14.2 g ATO sol, 204.6 g 1:1 (w/w) isopropyl alcohol:diacetone alcohol, and 131.2 g of the concentrate as prepared for 0° C.-1 (i.e., dissolving an 85:15 weight-to-weight ("w/w") mixture of SR444C and ELVACITE 2041 in acetone to 10 wt % total solids). The contents were swirled to ensure uniform mixing of the components. The resulting deep blue dispersion contained 1.25 wt % ATO nanoparticles and 3.75 wt % 85:15 SR444C:Elvacite 2041.

Preparation of Silver Nanowire Ink

A wide mouth screw top jar was charged with 58.85 grams of 0.05 wt % FC-4430 solution and 12.57 g of 2.5 wt % METHOCEL E4M solution, and the mixture was swirled until homogeneous to the unaided eye with 20:20 vision. SLV-NW-60 silver nanowire dispersion was then added in portions with swirling until a total of 26.78 grams dispersion had been added. The mixture was swirled by hand to ensure uniform dispersion of the silver nanowires, and then an additional 49.1 grams of the 0.05 wt % FC-4430 solution was added and the mixture was agitated by hand until homogeneous. The final dispersion was 0.24 wt % silver nanowires, 0.21 wt % hydroxypropyl-methylcellulose, and 0.037 wt % FC-4430.

Preparation of Transparent Electrodes TE1 to TE4

The silver nanowire ink prepared above was coated on 6 inch (15.2 cm) width, 5 mil (0.13 mm) gauge MELINEX 618 film using a 4 inch (10.2 cm) slot die coater operating at a web speed of 10 ft/min (3 m/min), ink flow rate of 4.0 cc/min, drying oven airflow 19.7 msec, and drying oven temperatures of 75° C. (zone 1) and 120° C. (zone 2). The above film was overcoated to make transparent electrode films using overcoat compositions "OC-1" (at 3 wt % solids) and "OC-2" (at 5 wt % solids). Coating was performed on the 4 inch (10.2 cm) die coater used for the ink coating, using the above oven and air flow settings, web speed of 20 ft/min (6.1 m/min), solution flow rates of 5 or 7 cc/min (as indicated in Table 2), UV plate temperature of 70° F. (21° C.), nitrogen atmosphere, and 100% UV lamp power. This procedure gave overcoats with nominal thicknesses in a range of 200 nm to 400 nm. Transmission, haze, and sheet resistance were measured using the methods described above. For the sheet resistance measurements, five samples taken from different sections of the rolls were measured, and average and standard deviation were recorded. Results are shown in Table 2.

TABLE 2

| Transparent Electrode | Overcoat | Overcoat Solution Flow Rate (cc/min) | Sheet Resistance (ohm/sq), (1 Std Dev) | Transmission (%) | Haze (%) |
|---|---|---|---|---|---|
| TE1 | OC-1 | 5 | 189 (43) | 86.9 | 4.8 |
| TE2 | OC-1 | 7 | 230 (14) | 88.8 | 4.0 |
| TE3 | OC-2 | 5 | 219 (19) | 86.9 | 8.6 |
| TE4 | OC-2 | 7 | 192 (26) | 86.6 | 7.1 |

Preparation of Transparent Electrodes TE5-TE8

The silver nanowire ink prepared above was coated on 6 inch (15.2 cm) width, 5 mil (0.13 mm) gauge MELINEX 618 film using a 4 inch (10.2 cm) slot die coater operating at a web speed of 10 ft/min (3 m/min), ink flow rate of 7.0 cc/min, drying oven airflow 19.7 msec, and drying oven temperatures of 75° C. (zone 1) and 120° C. (zone 2). The above film was overcoated to make transparent electrode films using overcoat compositions "OC-1" (at 3 wt % solids) and "OC-3" (at 5 wt % total solids). Coating was performed on the 4 inch (10.2 cm) die coater used for the ink coating, using the above oven and air flow settings, web speed of 20 ft/min (6.1 m/min), solution flow rates of 7 or 9 cc/min (as indicated in Table 3), UV plate temperature of 70° F. (21° C.), nitrogen atmosphere, and 100% UV lamp power. This procedure gave overcoats with nominal thicknesses in a range of 400 nm to 500 nm. Transmission, haze, and sheet resistance were measured using the methods described above. Measurements were taken on opposite ends of film samples 5-15 ft long (denoted as End 1 and End 2), and both sets of values are reported in Table 3.

TABLE 3

| Sample ID | Overcoat | Flow (cc/min) | SR (Delcom, ohm/sq) End 1 | End 2 | % T End 1 | End 2 | % H End 1 | End 2 |
|---|---|---|---|---|---|---|---|---|
| TE5 | OC-1 | 7 | 92 | 91 | 87.9 | 87.8 | 5.1 | 5.2 |
| TE6 | OC-1 | 9 | 95 | 85 | 88.7 | 88.8 | 5.3 | 5.4 |
| TE7 | OC-3 | 7 | 97 | 95 | 87.2 | 87.2 | 6.1 | 6.1 |
| TE8 | OC-3 | 9 | 95 | 94 | 86.6 | 86.5 | 5.7 | 5.7 |

Example 1

Individual sheets of transparent electrode samples TE1-TE4 above were run coated face up through an air corona discharge (one pass) using a corona treater (obtained from Sherman Treaters, UK, under the trade designation "HT3") operating at 100% power, estimated discharge power 330 W, line speed 10 m/min, and gap setting 1. Under these conditions, the estimated energy/unit area is 0.43 J/cm$^2$. Before and after corona treatment, samples were subjected to measurements of sheet resistance ("SR"; as determined by both Delcom and 2-point measurements), transmission ("% T"), and haze ("% H"). Results are shown in Table 4 below.

TABLE 4

| Sample | Condition | SR (ohm/sq, Delcom) | SR (ohm/sq, 2-pt) | % T | % H |
|---|---|---|---|---|---|
| TE1 | Initial | 263 | 162 | 88.6 | 3.8 |
| TE1 | Corona treated | NR | NR | 88.9 | 3.5 |
| TE2 | Initial | 208 | 145 | 89.8 | 3.8 |
| TE2 | Corona treated | NR | NR | 90.1 | 3.9 |
| TE3 | Initial | 208 | 148 | 87.9 | 8.8 |
| TE3 | Corona treated | NR | NR | 88.2 | 8.7 |
| TE4 | Initial | 222 | 207 | 87.7 | 7.7 |
| TE4 | Corona treated | 2500 | 6800 | 87.6 | 7.9 |

For the Delcom measurements in Table 4, "NR" (i.e., "no reading") signifies sheet resistance >20000 ohm/sq; for the 2-point measurements, "NR" signifies sheet resistance >1 Megaohm/sq. These conditions are interpreted to indicate loss of conductivity for corona treated TE1, TE2, and TE3 examples shown in Table 4.

The above experiments were repeated using samples of transparent electrodes TE1-TE3, except that strips of 5 cm wide 3M 8403 pressure-sensitive adhesive tape were laminated to the coated side of each film as a mask before corona treatment. Samples were then passed through the corona treater using the same conditions as above. The tape strips were removed, and measurements of sheet resistance, transmission, and haze were made in the masked and unmasked areas. Results are shown below in Table 5.

TABLE 5

| Sample | Treatment Conditions | SR (ohm/sq, Delcom) Fresh | SR (ohm/sq, Delcom) After | SR (ohm/sq, 2 pt) Fresh | SR (ohm/sq, 2 pt) After | % T Fresh | % T After | % H Fresh | % H After |
|---|---|---|---|---|---|---|---|---|---|
| TE1 | Air corona | 226 | NR | 148 | NR | 88.1 | 88.3 | 3.9 | 3.7 |
|  | Taped | 226 | 216 | 148 | 185 | 88.1 | 88.1 | 3.9 | 3.9 |
| TE2 | Air corona | 240 | NR | 167 | NR | 89.5 | 89.6 | 3.8 | 4.0 |
|  | Taped | 240 | 235 | 167 | 200 | 89.5 | 89.6 | 3.8 | 4.1 |
| TE3 | Air corona | 202 | NR | 133 | NR | 87.5 | 86.5 | 8.9 | 8.5 |
|  | Taped | 202 | 186 | 133 | 165 | 87.5 | 87.5 | 8.9 | 9.0 |

In Table 5: "Fresh"=before corona treatment; "After"=after corona treatment; "NR" signifies sheet resistance >1 Megaohm/sq. Note that in the taped areas, little or no change was observed in the Fresh and After SR values, suggestive of a protection of the conductive coating. The data shown in Table 5 indicated that while the corona treatment destroyed conductivity in the unmasked areas with little change in haze and transmission values of the coating, the adhesive tape mask protected the conductor such that conductivity was retained after corona treatment.

Example 2

Sample TE2 was treated by exposure to a corona discharge using a treater apparatus essentially according to the description in U.S. Pat. No. 7,442,442 (Strobel et al.), column 5 lines 28-48, with the modification that an uncoated steel grounding roll was utilized in place of the ceramic-coated roll cited in the reference. During treatment, a sheet of sample TE2 was held in contact with a 25 cm diameter, 50 cm face-width uncoated steel ground roll manufactured by American Roller of Union Grove, Wis. The powered electrode consisted of two 200 cm$^2$, 33 cm face-width stainless steel shoes separated from the ground roll by an electrode gap of 1.5 mm.

A mask was prepared by cutting a 8.6 cm diameter hole in a 18×30 cm sheet of 5 mil thick PTFE film (obtained from Fluoro-Plastics Inc., Philadelphia, Pa.). For treatment, sheets of TE2 film were taped to the carrier film web using 3M 8403 pressure-sensitive adhesive tape, and then the mask was taped over the conductive coating to provide a circular unprotected area in the middle of the sample that would be exposed directly to the corona discharge. A PTFE-TE2 laminate on the carrier web was treated with a corona at energy/area of 0.6 J/cm$^2$ (discharge power 250 W, line speed 7.5 m/min) and sheet resistance, transmission, and haze were measured inside and outside of the circular treated area. A sheet resistance of greater than 10$^6$ ohm/sq was observed inside the unmasked area, while outside the circle conductivity was retained (Delcom sheet resistance 180-250 ohm/sq). Optical results were as follows: Transmission 89.3% inside circle, 89.6% outside circle; Haze 3.8% inside circle, 4.1% outside circle.

Figure 6:
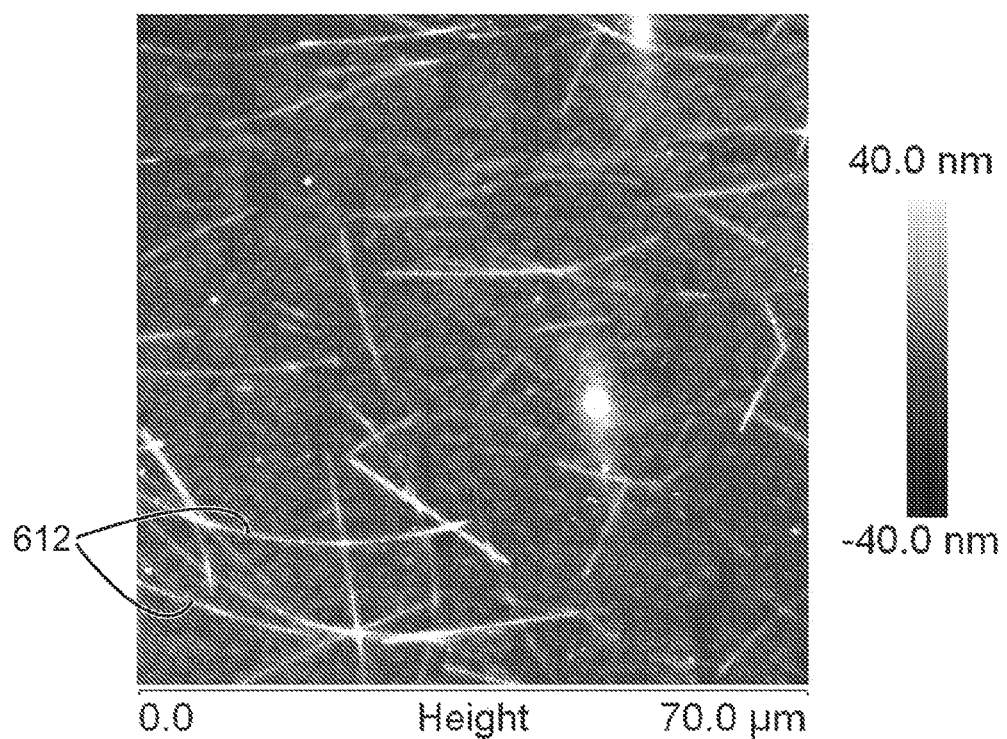
FIG. 6 is an atomic force microscopy image of an untreated area of a transparent electrically conductive film described herein.
Figure 7A:
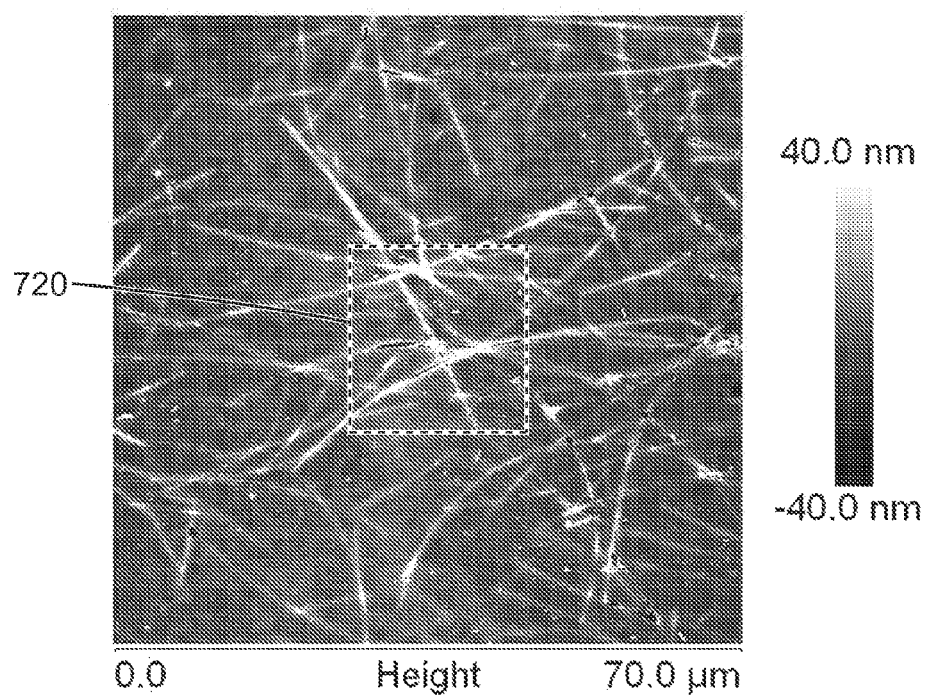
FIG. 7A is an atomic force microscopy image of a corona-treated area of a transparent electrically conductive film described herein.
Figure 7B:
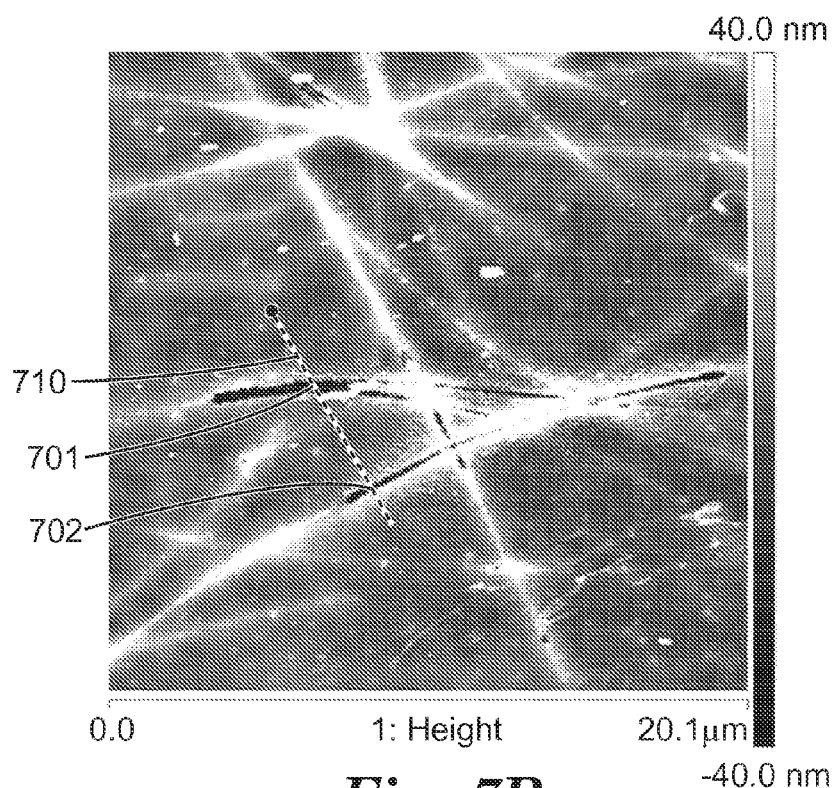
FIG. 7B is an enlarged inset area of FIG. 7A.
Figure 7C:
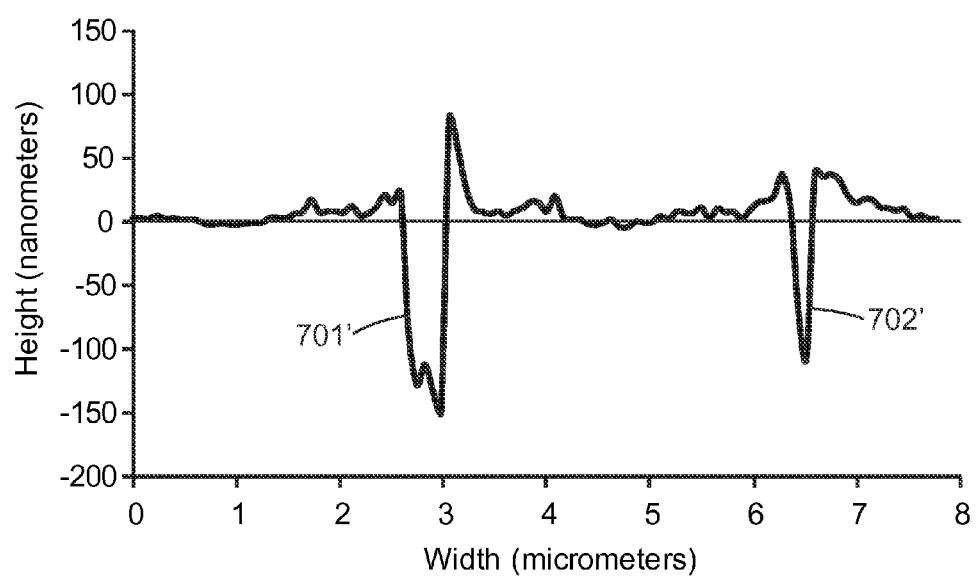
FIG. 7C is a profile analysis of the corona-treated area of FIG. 7B.

An AFM image of an untreated area of the above TE2 sample is shown in FIG. 6, showing nanowires 612. An AFM image of a corona-treated area of the above TE2 sample is shown in FIG. 7A, and FIG. 7B shows an enlarged inset 720 from FIG. 7A, including darker areas 701 and 702 that cross line 710. FIG. 7C is a profile analysis taken along line 710, showing the presence of nanotrenches 701' and 702' that replace randomly distributed segments of silver nanowires, showing depth 100-150 nm and width less than 1.0 micrometer. From analysis of these AFM images, it appeared that portions of the silver nanowires were ablated by exposure to the discharge, leaving trenches or recessed areas where the ablated portions of nanowires had been.

Example 3

Samples of TE1-TE4 were exposed to a 80% helium-20% oxygen corona discharge using an atmospheric pressure plasma treater (obtained from Enercon Industries, Menomonee Falls, Wis., under the trade designation "MODEL LM4453-61"). The treater incorporated a ceramic-covered grounded backing roll and two assemblies of high-voltage ceramic-covered electrodes with process gas introduction ports, separated from the ground roll face by approximately 1 mm. Each electrode assembly contained two electrodes with 30 cm×2.5 cm active area facing the ground roll, and the two electrode assemblies were purged with a flow of 20% oxygen in helium at a rate of approximately 50 liters/min. Samples were exposed by taping pieces of coated film to the carrier web using pressure-sensitive adhesive tape (obtained from 3M Company, St. Paul, Minn., under the trade designation "3M 8403"). A low-power condition (discharge power 250 W, line speed 49 m/min, energy/area 0.1 J/cm$^2$) produced no loss of conductivity on any of the samples after exposure (i.e., sheet resistance before and after corona treatment was essentially unchanged). A higher-power condition (discharge power 250 W, line speed 3.2 m/min, energy/area 1.5 J/cm$^2$) gave complete loss of conductivity (i.e., sheet resistance of greater than 10$^6$ ohm/sq) on TE1 and TE2 but no loss of conductivity (i.e., sheet resistance before and after corona treatment was essentially unchanged) on TE3 and TE4. Conductivity was retained in the areas of TE1 and TE2 that had been under the adhesive tape laminating the samples to the carrier web. Sample TE1 also showed a light brown color in the corona-exposed area, while this color shift was barely discernible on TE2.

Example 4

Film samples of TE5-TE8 were exposed to corona discharge using the apparatus and methods described in Example 3. A first mask, having a "large hole" (denoted "1 g hole"), was prepared by cutting a 8.6 cm diameter hole in a 18×30 cm sheet of 20 mil thick PTFE film (obtained from Fluoro-Plastics Inc., Philadelphia, Pa.). A second mask, having "small holes" (denoted "sm hole"), was prepared using the same PTFE substrate and a series of 3.2 cm diameter holes cut using an Accu-Cut Systems (Fremont, Nebr.) Mark IV roller cutting system equipped with a 218 die. For corona treatment, sheets of transparent electrode films were taped to the carrier film web using "3M 8403" pressure-sensitive adhesive tape, and then the mask was taped over the conductive coating to provide unprotected areas that would be exposed directly to the corona discharge along with areas under the PTFE film that would be protected from the discharge. Samples, including controls with no mask, were run at various input power levels in order to identify conditions sufficient to deactivate the silver nanowire conductivity in the exposed areas. Sheet resistance, transmission, and haze were measured in unexposed and exposed areas, and the resulting data are shown in Table 6. For the experiments involving no mask, results given are for the corona-exposed areas. For the experiments involving masks, "Unpatt." refers to areas under the mask film and protected from the corona discharge, while "Patt." refers to areas exposed to the corona discharge.

TABLE 6

| Ex. | Film ID | Conditions | Energy/Area, J/cm² | SR (Delcom, ohm/sq) Unpatt. | SR (Delcom, ohm/sq) Patt. | % T Unpatt. | % T Patt. | % H Unpatt. | % H Patt. |
|---|---|---|---|---|---|---|---|---|---|
| 4.1 | TE5 | No mask | 0.75 | 240 | N/A | 87.6 | N/A | 4.96 | N/A |
| 4.2 | TE5 | No mask | 1.5 | NR | N/A | 87.3 | N/A | 4.73 | N/A |
| 4.3 | TE5 | Lg hole mask | 1.5 | 93 | NR | 88 | 87.1 | 5.25 | 4.65 |
| 4.4 | TE6 | No mask | 1.5 | 633 | N/A | 88.6 | N/A | 5.16 | N/A |
| 4.5 | TE6 | No mask | 2 | NR | N/A | 87.9 | N/A | 5.06 | N/A |
| 4.6 | TE6 | Sm hole mask | 2 | 91 | NR | 88.9 | 88.3 | 5.45 | 4.88 |
| 4.7 | TE6 | Lg hole mask | 2 | 90 | NR | 88.7 | 88.3 | 5.45 | 4.81 |
| 4.8 | TE7 | No mask | 2 | 408 | N/A | 87.3 | N/A | 5.88 | N/A |
| 4.9 | TE7 | No mask | 3 | NR | N/A | 87.1 | N/A | 5.53 | N/A |
| 4.10 | TE7 | No mask | 4 | NR | N/A | 86.9 | N/A | 5.84 | N/A |
| 4.11 | TE7 | Lg hole mask | 4 | 91 | NR | 87.3 | 86.6 | 6.28 | 5.99 |
| 4.12 | TE7 | Sm hole mask | 4 | 89 | NR | 87.4 | 86.8 | 6.23 | 5.67 |
| 4.13 | TE8 | No mask | 4 | 113 | N/A | 87.7 | N/A | 5.55 | N/A |
| 4.14 | TE8 | No mask | 8 | NR | N/A | 87.8 | N/A | 7.2 | N/A |
| 4.15 | TE8 | Lg hole mask | 8 | 93 | NR | 86.5 | 86.9 | 5.52 | 8.85 |
| 4.16 | TE8 | Sm hole mask | 8 | 96 | NR | 86.8 | 87.2 | 5.86 | 8.65 |

Figure 8:
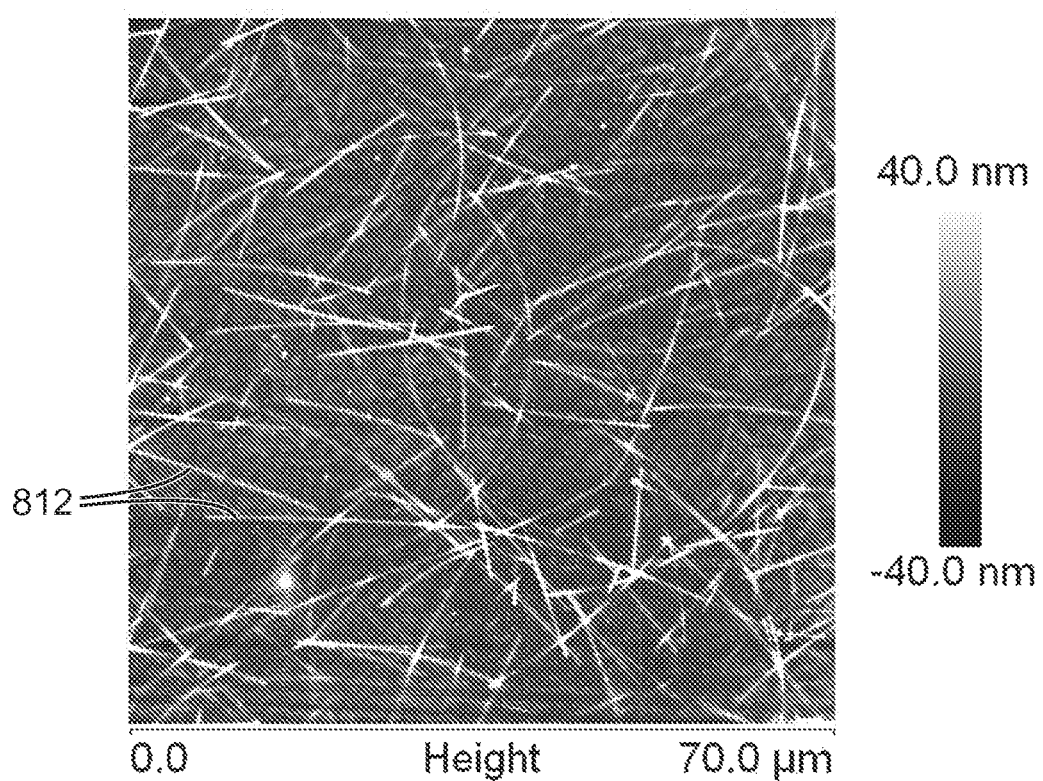
FIG. 8 is an atomic force microscopy image of an untreated area of a transparent electrically conductive film described herein.
Figure 9A:
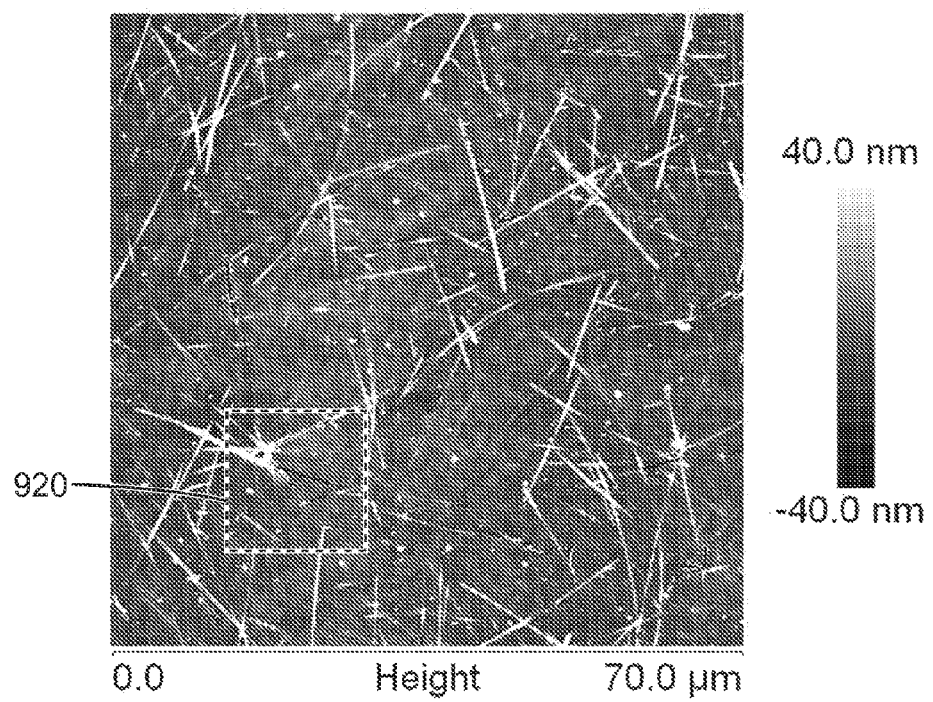
FIG. 9A is an atomic force microscopy image of a corona-treated area of a transparent electrically conductive film described herein.
Figure 9B:
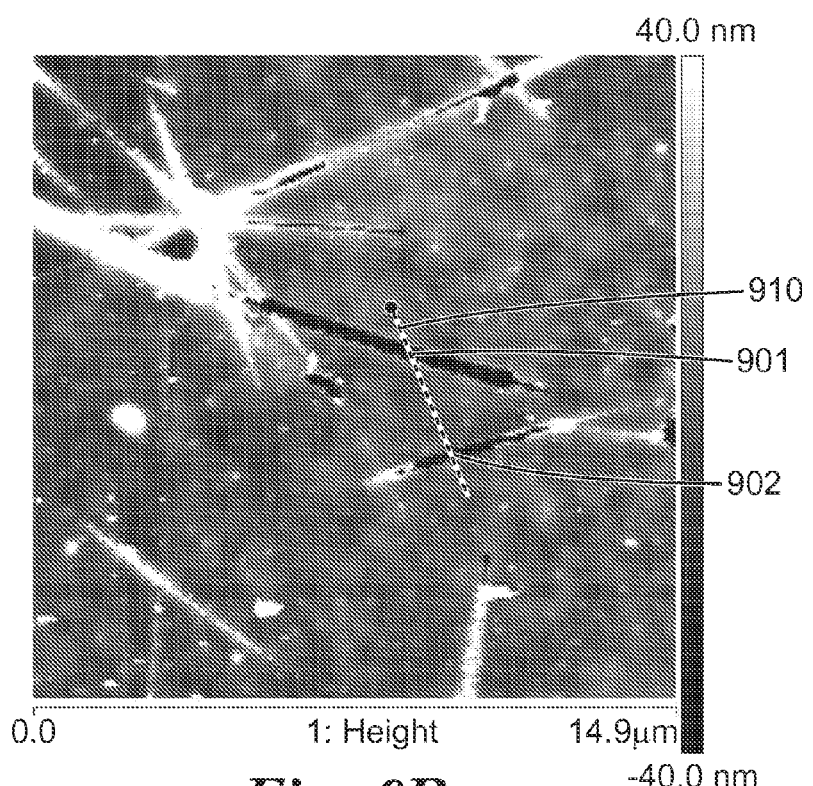
FIG. 9B is an enlarged inset area of FIG. 9A.
Figure 9C:
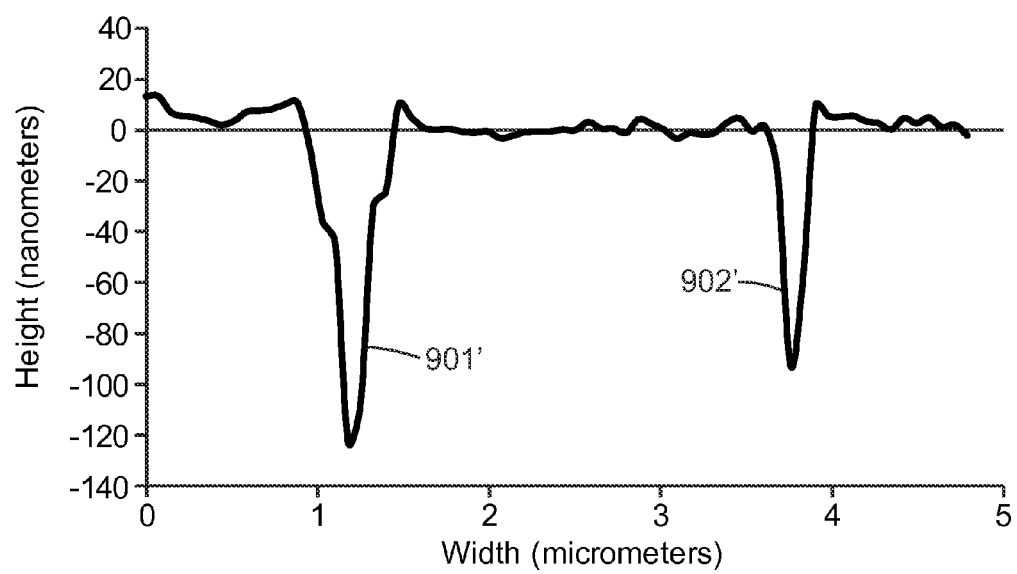
FIG. 9C is a profile analysis of the corona-treated area of FIG. 9B.

An AFM image of sample 4.3 obtained in an unirradiated (control) area is shown in FIG. 8, showing nanowires 812. An AFM image of a corona-treated area of sample 4.3 is shown in FIG. 9A, and FIG. 9B shows an enlarged inset 920 from FIG. 9A, including darker areas 901 and 902 that cross line 910. FIG. 9C is a profile analysis taken along line 910, showing the presence of nanotrenches 901' and 902' that replace randomly distributed segments of silver nanowires, the trenches approximately 100-150 nm deep and less than 1.0 micrometer in width. From analysis of these AFM images, it appeared that portions of the silver nanowires were ablated by exposure to the discharge, leaving trenches or recessed areas where the ablated portions of nanowires had been.

Figure 10:
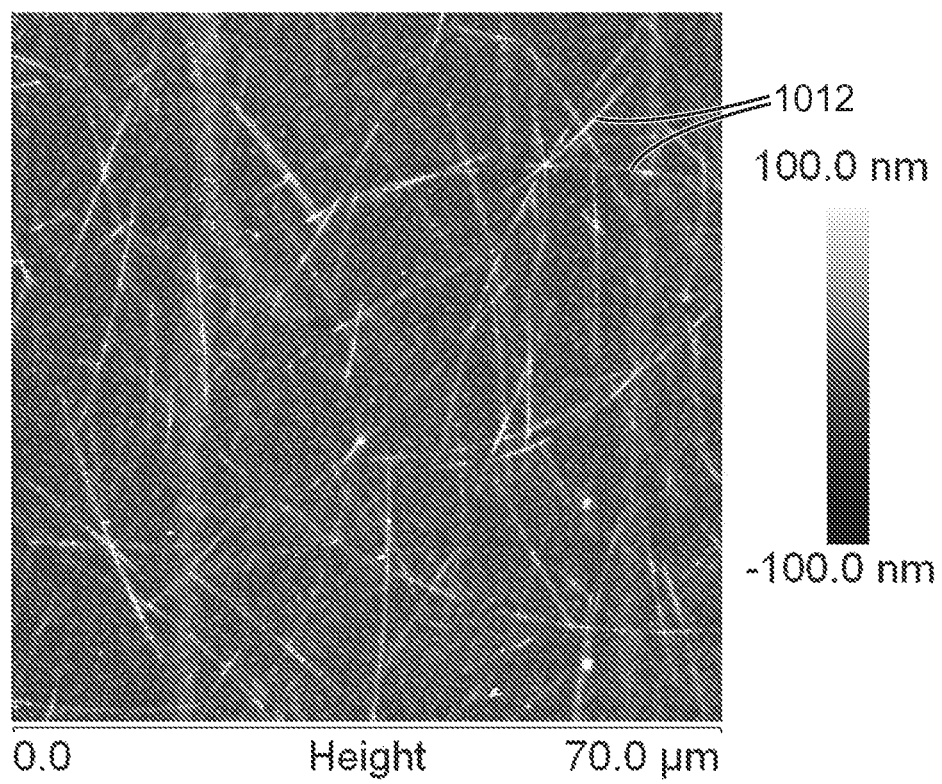
FIG. 10 is an atomic force microscopy image of an untreated area of a transparent electrically conductive film described herein.
Figure 11A:
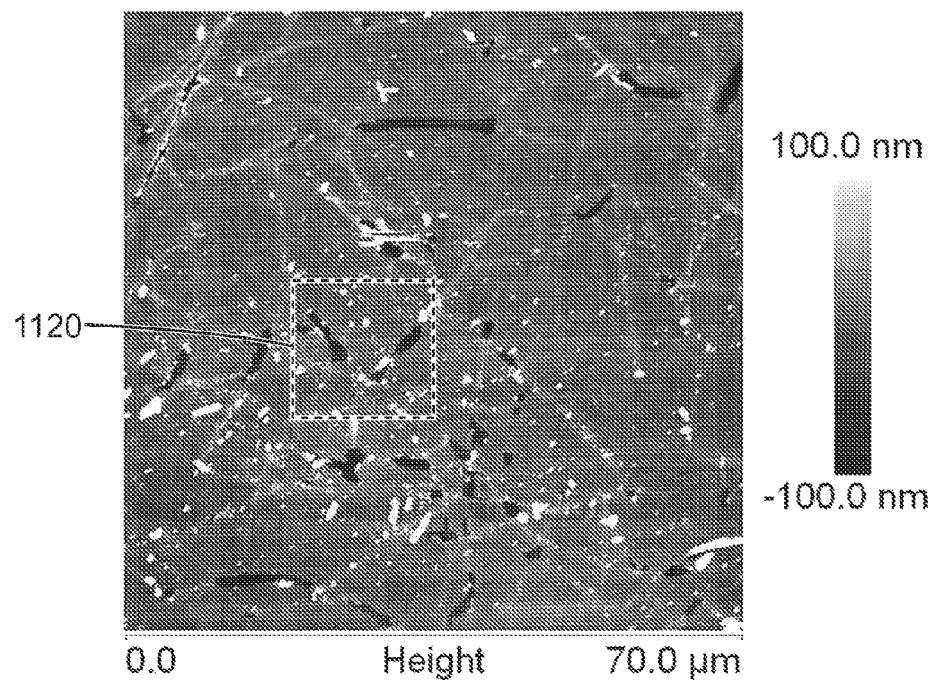
FIG. 11A is an atomic force microscopy image of a corona-treated area of a transparent electrically conductive film described herein.
Figure 11B:
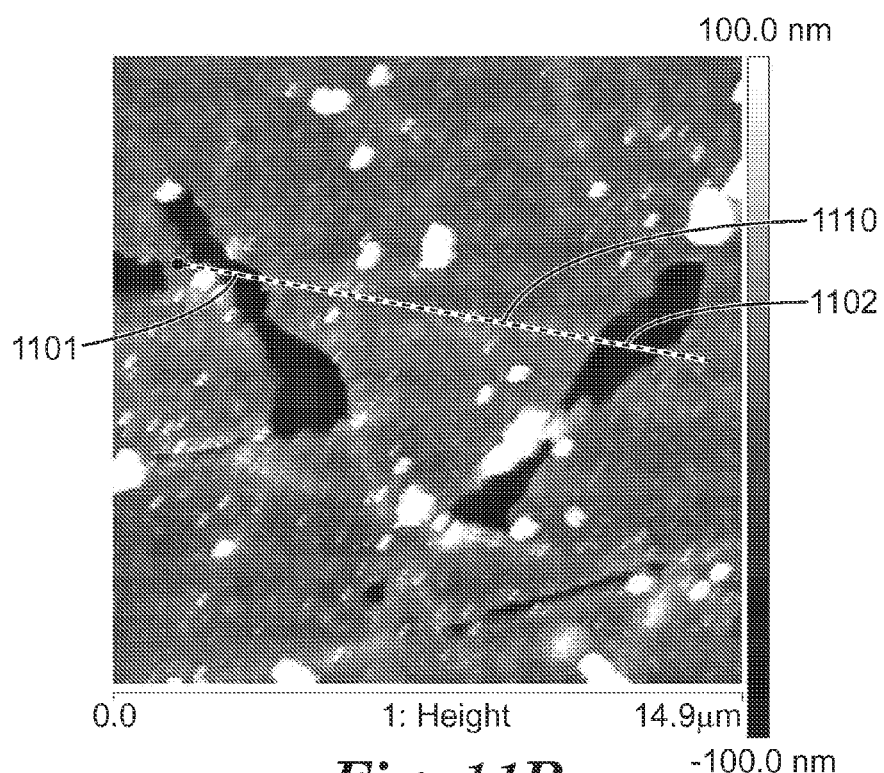
FIG. 11B is an enlarged inset area of FIG. 11A.
Figure 11C:
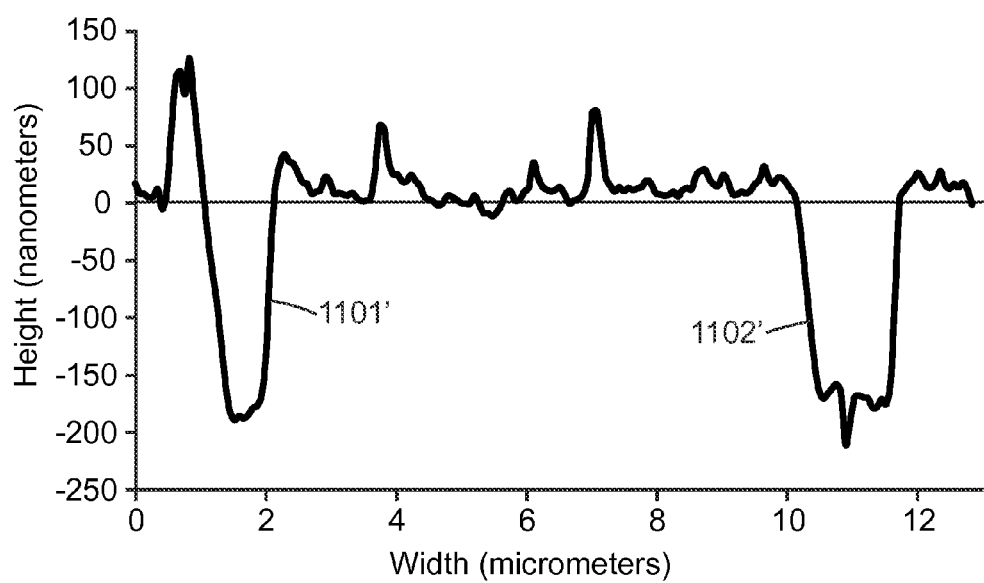
FIG. 11C is a profile analysis of the corona-treated area of FIG. 11B.

An AFM image of sample 4.15 obtained in an unirradiated (control) area is shown in FIG. 10, showing nanowires 1012. An AFM image of a corona-treated area of sample 4.3 is shown in FIG. 11A, and FIG. 11B shows an enlarged inset 1120 from FIG. 11A, including darker areas 1101 and 1102 that cross line 1110. FIG. 11C is a profile analysis taken along line 1110, showing the presence of nanotrenches 1101' and 1102' that replace randomly distributed segments of silver nanowires, the trenches approximately 200 nm deep and up to approximately 2 micrometers in width. From analysis of these AFM images, it appeared that portions of the silver nanowires were ablated by exposure to the discharge, leaving trenches or recessed areas where the ablated portions of nanowires had been. The nanotrenches in FIG. 11C are of larger dimension than those in FIG. 9C, and this difference is attributable to the higher discharge power used for treatment of 4.15 vs. that used for treatment of 4.3.

What is claimed is:

1. A method comprising:
   providing a transparent electrically conductive film comprising:
      a transparent substrate;
      a composite layer comprising:
         an electrically conductive layer disposed on at least a portion of a major surface of the transparent substrate and comprising a plurality of interconnecting metallic nanowires; and
         a polymeric overcoat layer disposed on a portion of the electrically conductive layer, to provide a coated area of the electrically conductive layer; and
   patternwise exposing the coated area of the electrically conductive layer to a corona discharge to provide a patternwise exposed electrically conductive film comprising (1) an unexposed region of the coated area having a first electrical resistivity, and (2) an exposed region having a second electrical resistivity;
   wherein the exposed region is less electrically conductive than the unexposed region, and wherein there is a ratio of the second electrical resistivity over the first electrical resistivity of at least 1000:1;
   wherein the metallic nanowires have at least one cross-sectional dimension less than 200 nm and the polymeric overcoat layer has a thickness of at least 200 nm; and
   wherein the corona discharge ablates portions of the plurality of interconnecting metallic nanowires forming trenches in the electrically conductive layer.

2. The method of claim 1, wherein the patternwise exposing comprises exposing the coated area of the electrically conductive layer to the corona discharge through a patterned mask.

3. The method of claim 2, wherein the patterned mask is laminated to the coated area of the electrically conductive layer.

4. The method of claim 2, further comprising removing the patterned mask from the unexposed region.

5. The method of claim 1, wherein the patternwise exposing comprises contacting the coated area of the electrically conductive layer to a patterned surface of a corona discharge treatment roller.

6. The method of claim 1, wherein the patternwise exposing comprises contacting the coated area of the electrically conductive layer to a patterned surface of a corona discharge treatment belt.

7. The method of claim 1, wherein the plurality of interconnecting metallic nanowires comprises silver nanowires.

8. The method of claim 1, wherein the exposed region and the unexposed region have substantially the same haze values.

9. The method of claim 1, wherein the exposed region and the unexposed region have substantially the same visible light transmission values.

10. The method of claim 1, wherein the patternwise exposed electrically conductive film is optically clear.

11. The method of claim 1, wherein patternwise exposing the electrically conductive layer to the corona discharge comprises chemically or physically transforming portions of the metallic nanowires to electrically insulative regions.

12. The method of claim 1 wherein the exposed region has a width that is at least 100 micrometers.

13. The method of claim 1 wherein the exposed region has an area that is at least 1 cm$^2$.

* * * * *

UNITED STATES PATENT AND TRADEMARK OFFICE
CERTIFICATE OF CORRECTION

PATENT NO. : 9,711,263 B2
APPLICATION NO. : 14/384100
DATED : July 18, 2017
INVENTOR(S) : Pellerite et al.

Page 1 of 1

It is certified that error appears in the above-identified patent and that said Letters Patent is hereby corrected as shown below:

In the Specification

Column 15
Line 12; Delete "0° C.-1" and insert -- OC-1 --, therefor.
Line 39; Delete "msec," and insert -- m/sec, --, therefor.

Column 16
Line 6; Delete "msec," and insert -- m/sec, --, therefor.

Column 18
Line 52-53; Delete ""1 g" and insert -- "lg --, therefor.

Signed and Sealed this
Twenty-second Day of May, 2018

Andrei Iancu
*Director of the United States Patent and Trademark Office*